United States Patent [19]

Herbst

[11] 4,236,168
[45] Nov. 25, 1980

[54] ONE-DIMENSIONAL CCD SENSOR WITH OVERFLOW ARRANGEMENT

[75] Inventor: Heiner Herbst, Haar, Fed. Rep. of Germany

[73] Assignee: Siemens Aktiengesellschaft, Berlin & Munich, Fed. Rep. of Germany

[21] Appl. No.: 15,050

[22] Filed: Feb. 26, 1979

[30] Foreign Application Priority Data

Mar. 28, 1978 [DE] Fed. Rep. of Germany ....... 2813254

[51] Int. Cl.³ .................. H01L 29/78; H01L 27/14; H01L 31/00; H01L 29/04
[52] U.S. Cl. .................................. 357/24; 357/30; 357/54; 357/59
[58] Field of Search ............... 357/24, 30; 307/221 D, 307/311

[56] References Cited

U.S. PATENT DOCUMENTS

| | | | |
|---|---|---|---|
| 3,983,573 | 9/1976 | Ishihara | 357/24 |
| 4,012,587 | 3/1977 | Ochi et al. | 357/24 |
| 4,081,841 | 3/1978 | Ochi et al. | 357/24 |
| 4,087,833 | 5/1978 | Tseng | 357/24 |

OTHER PUBLICATIONS

Herbst et al., "Modulation Transfer Function of Quadrilinear CCD Imager" Electronics Letters, vol. 12, (Dec. 9, 1976).

Primary Examiner—Gene M. Munson
Attorney, Agent, or Firm—Hill, Van Santen, Steadman, Chiara & Simpson

[57] ABSTRACT

A linear row of MIS capacitors as sensor elements are arranged on a doped semiconductor body. The MIS capacitors are separated in the semiconductor body by a potential threshold for the optically generated minority carriers. The potential threshold, for example, can be generated by means of a field shield electrode. By means of transfer gates the sensor elements are alternately coupled with CCD shift registers. An oppositely doped overflow drain which is contacted with an overflow electrode connects to the narrow side of each sensor element which is opposite the corresponding transfer gate. Each overflow drain is separated from the sensor elements by a potential threshold for the minority carriers which is smaller than the potential threshold between the sensor elements themselves. A varying thickness of the oxide layer, a varying doping and/or parts of the field shield electrode can serve for adjusting the potential threshold. In this manner, in a sensor of high component density for the electronic image gathering, an overflow arrangement is incorporated without any additional space requirement.

9 Claims, 6 Drawing Figures

ONE-DIMENSIONAL CCD SENSOR WITH OVERFLOW ARRANGEMENT

BACKGROUND OF THE INVENTION

The invention relates to an optoelectronic sensor with overflow arrangement which contains a series of sensor elements arranged on a doped semiconductor body of the first conductivity type and comprising MIS capacitors for the collection of optically generated minority carriers. The sensor elements are separated from one another by means for the generation of a potential threshold for the minority carriers in the semiconductor body. The sensor further contains at least one shift register formed of further MIS capacitors on each side of the sensor row and contains transfer electrodes arranged to the side of the sensor electrodes which alternately connect the sensor elements with a capacitor of the two shift channels according to the principle of charge-coupling.

One-dimensional optoelectronic sensors contain sensor elements arranged in a row which are in a position to convert the intensity of the light incident upon them into an electric signal. They are employed, for example, for scanning the linear dimensions of objects, for example, work pieces in production, or also for the line-wise scanning of images to be electronically read, for example, in facsimile transmission.

In increasing amount, metal electrode isolator semiconductor (MIS) capacitors are being used as sensor elements and which consist of a doped semiconductor body covered with an insulation layer and a light-permeable, superimposed "metal electrode" (generally consisting of strongly doped polysilicon). When, for example, in a p doped semiconductor substrate, the substrate connection of the MIS capacitor is negatively biased with respect to the electrode, then the (positive) majority carriers of the substrate are stripped from the substrate connection, whereas the optically generated minority carriers are held under the sensor electrode. This charge package consisting of minority carriers can be periodically read out into a shift register formed of further MIS capacitors in that a transmission electrode (transfer gate) is arranged above the insulation layer between the sensor electrode and the electrode of a shift register capacitor, which transfer gate, insulated only by a thin oxide layer, connects directly to or, respectively, slightly overlaps the two electrodes. When the transfer gate is applied to a negative potential with respect to the substrate connection, then a potential barrier arises for the optically generated, negative charge carriers (minority carriers) which prevents the flow of the minority carriers out of the sensor element into the shift register during the collection of the optically generated charge carriers. When, however, the transfer gate is applied to a sufficiently positive potential, then a potential difference arises for the minority carriers from the sensor element into the semiconductor area under the transfer gate and the charge flows off in that direction. In the same manner, the charge carriers can then be further displaced into the capacitor of the shift register.

For a reading of the image which is as faithful as possible, it is necessary to lay a plurality of sensor elements which are as close as possible to one another. Therefore, a minimum distance between two sensor elements of a one-dimensional sensor is predetermined in that a plurality of further MIS capacitors for the displacement of the charge are required in the shift register proceeding next to the sensor row between two capacitors designed for the reception of the charge packets from the sensor elements. In the article "Modulation Transfer Function of Quadrilinear C.C.D. Imager" (Electronics Letters, Vol. 12, No. 25), Herbst and Pfleiderer specify a particularly spacesaving arrangement in which a shift register is arranged on each side of the sensor row. The sensor elements are now coupled in succession once with an MIS capacitor of the right and once with an MIS capacitor of the left shift register via transmission electrodes. It is further proposed to arrange a second, parallel shift register on each side. Each second charge package which is displaced into the inner shift register in the immediate proximity of the sensor row via a first transmission electrode or transfer gate is then further displaced by means of a second transmission electrode or transfer gate into an MIS capacitor of the corresponding outer shift register which runs parallel. The MIS capacitor of the inner shift register required for the displacement of the charge package out of the sensor element into the outer shift register can be used, upon the subsequent read-out of the charge package out of the shift registers, for the displacement of the charges along the shift register.

With strong light incidence upon individual sensor elements or a group of sensor elements, it can occur that so many minority carriers are optically generated that they overflow into neighboring sensor elements (blooming) and lead to the destruction of the information in larger areas of the sensor. This phenomenon can be prevented when oppositely doped overflow areas (drain areas) are provided on the semiconductor surface which are contacted with corresponding overflow electrodes and can strip charge carriers overflowing out of the sensor elements out of the substrate. Between the sensor elements and the overflow areas, however, a potential threshold must exist which is high enough that the minority carriers are prevented from flowing into the overflow area upon normal exposure and only diffuse off into the overflow area upon exposure that is too strong, i.e. when all minority carriers can no longer be stored in the sensor element. This potential threshold must be lower than the potential threshold between the individual sensor elements and can be generated in that an additional gate is arranged between the overflow areas and the sensor elements by means of which the potential path between overflow area and sensor electrode can be controlled. In order to apply this principle to one-dimensional sensors, however, considerable space is required for the overflow areas, overflow electrodes and their control installations. This considerably limits the resolution of the sensor.

SUMMARY OF THE INVENTION

An object of the invention is to specify a one-dimensional sensor of the type initially cited which contains an overflow arrangement which allows a high component density of the linearly arranged sensor elements.

This is achieved according to the invention in that at the side of each sensor element the surface of the semiconductor body contains an overflow area of the second conductivity type which extends to the side of the sensor element opposite that of the corresponding transfer gate. The overflow areas are contacted with an overflow electrode via windows in the insulation layer. Further, means are provided which generate a potential threshold for minority carriers between the overflow areas and the sensor elements which is lower in comparison to the potential threshold between the overflow areas themselves.

A potential threshold for the minority carriers can be generated between the sensor elements among one another and between the sensor elements and the overflow areas in that the semiconductor body exhibits a stronger doping of the same conductivity type in this intermediate area than below the sensor electrodes. But one can also arrange a shielding electrode (field shield gate) in this intermediate area which is separated from the semiconductor surface by an insulation layer. Therefore, for example, a high potential threshold can be generated for negative charge carriers by means of a negative gate voltage. Since the influence of a gate potential on the potential difference in the semiconductor body decreases with an increasing insulation layer thickness between the gate and the semiconductor surface, the height of the potential threshold can also be further influenced by means of the thickness of the insulation layer. Thus, in particular, the sensor electrodes can be designed as a continuous layer and the potential threshold between the sensor elements can be achieved by means of an enlargement of the insulator layer thickness. This electrode layer can even extend over the overflow area and form the overflow electrodes themselves, whereby a potential threshold between the sensor elements and the overflow area can be likewise generated by means of an enlargement of the insulation layer thickness.

There thus ensues the advantageous possibility of designing the sensor electrodes as an electrode layer extending over the entire series. Beyond the sensor elements, the insulation layer for generating the potential threshold is thicker than in the MIS capacitors of the sensor elements. For generating the potential threshold around the sensor elements, in place of or in addition to the above, a field shield gate can be embedded in the insulation layer between the electrode layer and the semiconductor surface. But the semiconductor can also contain a stronger doping of the first conductivity type in the area beyond the sensor elements than under the sensor electrodes themselves. These measures can be used both for the mutual separation of the sensor elements as well as for the separation between the sensor elements and the overflow areas, whereby they are dimensioned in such manner that the potential theshold between sensor elements and overflow areas is lower than the potential theshold between the sensor elements among themselves.

Preferably, the electrode layer overlaps the overflow areas. The field shield gate winds in meander-like fashion between the sensor elements and the overflow areas. Therefore, a particularly high potential threshold is generated between the sensor elements among themselves as well as between the sensor elements and the overflow areas. The potential threshold between the sensor elements and the overflow areas is reduced with respect to the potential threshold between the sensor areas with respect to one another.

DESCRIPTION OF THE PREFERRED EMBODIMENTS

Figure 1:
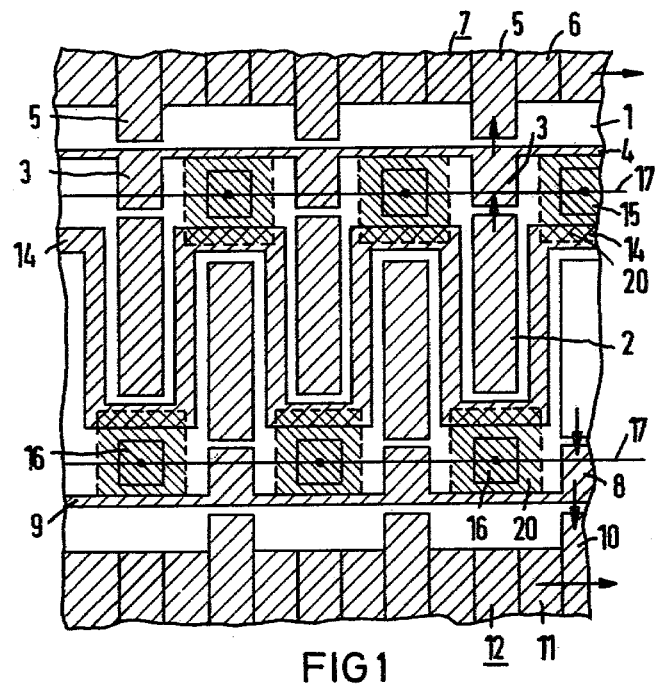
FIG. 1 illustrates a schematic construction of the dopings, insulation layers and electrodes on a section of the semiconductor surface in a sensor according to the invention.

The arrangement of the doped areas and the electrodes on the surface of a semiconductor body 1 is schematically illustrated in FIG. 1. There, 2 indicates the MIS capacitors arranged in a row and 3 indicates transmission electrodes or transfer gates which are controlled via a line 4 and displace the charge packages found in each second sensor element 2 from each second sensor element 2 into further MIS capacitors 5 which, together with other MIS capacitors 6, form a shift register 7 on the one side of the sensor element row. The other sensor elements 2 are analogously connected on the other side via transmission electrodes or transfer gates 8 and their clock pulse lines 9 to MIS capacitors 10 according to the principle of charge-coupling, whereby these capacitors 10 form the other shift register 12 together with further MIS capacitors. The displacement direction of the charge packages from the sensor elements 2 into the shift registers 7 and in the shift registers 7 themselves are indicated by means of arrows.

In order to separate the sensor elements 2 in the common semiconductor body 1 from one another by means of a potential theshold for the minority carriers, a field shield gate 14 is provided which winds in meander-like fashion around the sensor elements 2. Overflow areas 15 or, respectively, 16, separated from the sensor elements 2 only by means of the field shield gate 14, are adjacent to these sensor elements 2 on the side opposite the displacement electrodes 3 or, respectively, 8. The overflow areas are doped opposite to the semiconductor body and are connected to overflow electrodes which are to be indicated by means of the line 17. Areas 20 extend around the overflow areas 15 or, respectively, 16 below the field shield gate 14 up to the proximity of the sensor elements 2, at which the insulation layer covering the semiconductor body is more thickly designed and, additionally, a higher doping of the semiconductor body is provided. The potential threshold between the overflow areas 15 and the sensor elements 2 is reduced in comparison to the potential threshold between the sensor elements 2 with respect to one another.

Figure 2:
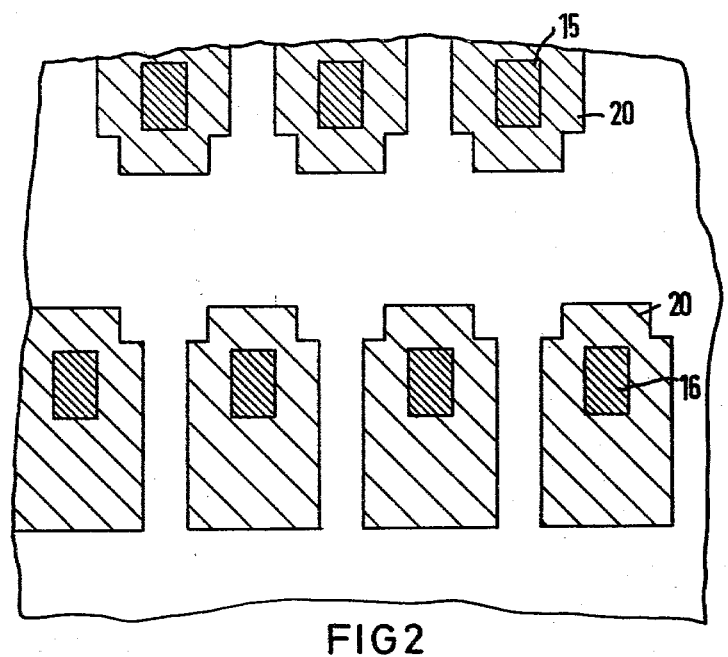
FIG. 2 illustrates the doping on the surface of the semiconductor body in a preferred first sample embodiment.

The more precise construction of a preferred sample embodiment of a sensor according to the invention is explained in FIGS. 2 through 5. FIG. 2 shows the doping on the surface of a silicon semiconductor body. In contrast to the p doping of about $7 \times 10^{14}$ cm$^{-3}$ of the semiconductor substrate, the areas 20 are more strongly doped with $2 \times 10^{16}$ cm$^{-3}$. The overflow areas 15 and 16 exhibit a strong n doping, for example $10^{19}$ through $10^{21}$ cm$^{-3}$ with arsenic or phosphorus.

Figure 3:
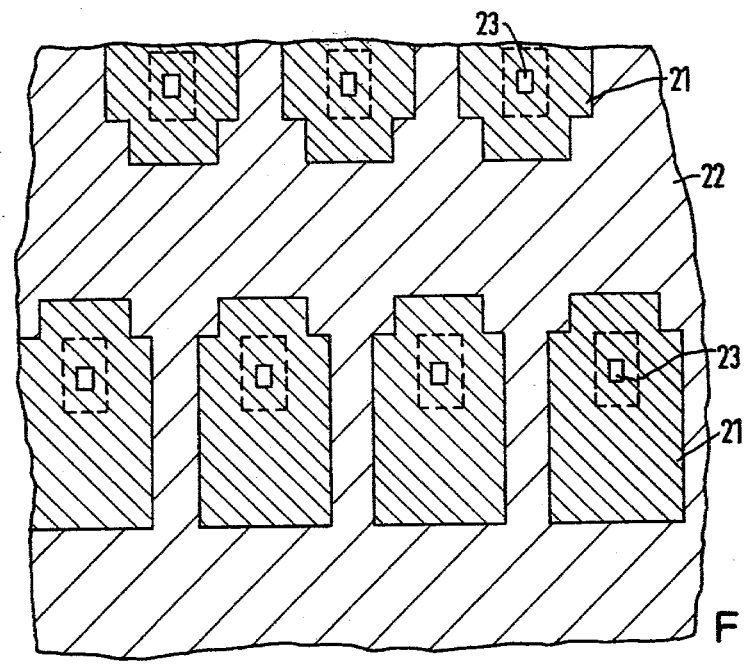
FIG. 3 illustrates the insulation layer on the semiconductor surface.

The semiconductor surface is covered with an insulation layer, generally an oxide layer 22 with a thickness of about 60 nm (FIG. 3). Therefore, contact windows 23 for contacting the overflow areas with the overflow electrodes are provided. Further, the oxide layer thickness over the areas 20 is increased to about 600 nm (field oxide 21). The production of the field oxide layer can be produced together with the strong doping of the areas 20 in a self-adjusting process.

Figure 4:
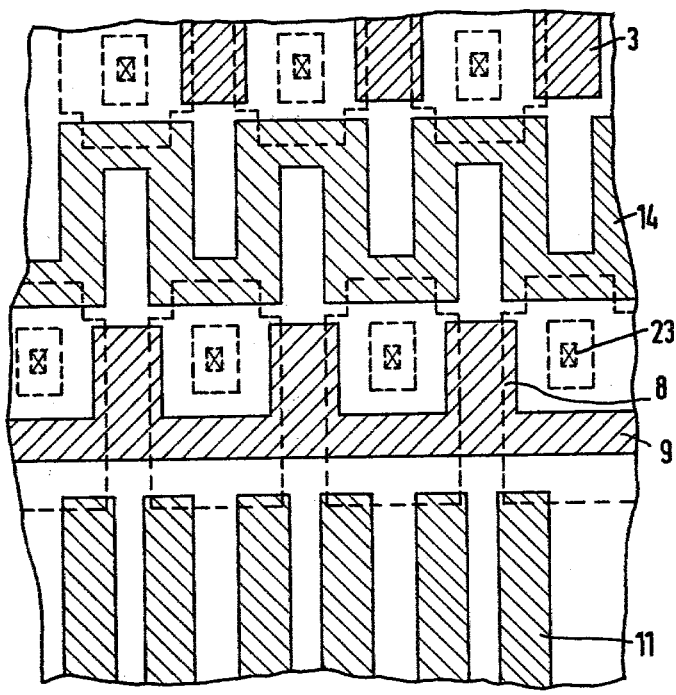
FIG. 4 illustrates the electrodes created from a first polysilicon layer.
Figure 5:
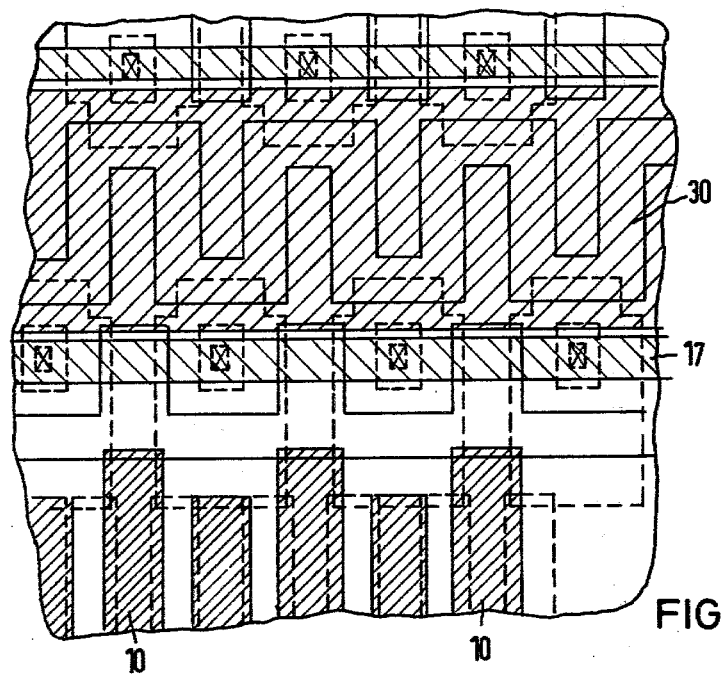
FIG. 5 illustrates the electrodes created from a second polysilicon layer and the overflow electrodes in this first sample embodiment.

A first electrode layer, preferably highly doped polysilicon, is applied (FIG. 4) to this insulation layer and from which the field shield gate 14, the transfer gates 3 and 8 with their control lines 4 and 9 as well as the electrodes of every second MIS capacitor 6 or, respectively, 11 of the shift registers 7 and 12 constructed according to the CCD principle are etched. In FIGS. 3 through 5, the contours of the previously applied elements are also respectively indicated. Therefore, one can see the efforts to avoid a superimposition of the edges of two layers lying above one another, whereby the exact geometry of the insulator layers and electrode layers is produced. A thin oxide layer is located over this first polysilicon layer except for the reserved contact windows 23 for the overflow electrodes - onto which a second polysilicon layer is applied.

As illustrated in FIG. 5, the electrodes of the MIS capacitors 5 and 10 are formed from this polysilicon layer in an etching process. These electrodes overlap the transfer gates 3 or, respectively, 8 and serve for the acceptance of the charge packages from the sensor electrodes according to the principle of charge-coupling. Likewise, the electrodes of further MIS capacitors of the CCD shift register and the sensor electrodes of the sensor elements 2 are formed from this second polysilicon layer. Therefore, the sensor electrodes are formed by a polysilicon strip 30 covering the sensor elements 2. This polysilicon strip covers all sensor elements including the field shield gate 14 as a common electrode.

In FIG. 5, further, contact lines 17 of aluminum are also indicated which are connected with the overflow areas 16 through the contact windows 23 and form the overflow electrodes. Further control lines which are required for the operation of the shift register are not indicated. These control lines can likewise consist of a light-impermeable material and connect laterally to the contact path of the overflow electrodes, whereby, at the same time, a limitation of the light-sensitive area of the sensor thereby arises, i.e., a protection of the transfer gates and shift registers against exposure.

During operation of the sensor, the field shield gate 14 continuously lies at negative potential, so that an accumulation layer of majority carriers forms under it and the egress of minority carriers in the area which lies under the field shield gate is suppressed. During the exposure time between two readout processes, the sensor electrodes of the capacitors 2 lie at positive potential, thus, optically generated minority carriers are collected, whereas the transfer gates 3 or, respectively, 8 lie at negative potential and thus an egress of minority carriers on this side of the sensor elements is also suppressed. Although the shielding potential of the field shield gates is boosted by means of the p+ doping of the areas 20, it is weakened by means of the field oxide layer in such manner that upon excessive exposure (i.e. when the potential under the sensor electrodes increases because of the collection of a greater plurality of optically generated minority carriers) the excess minority carriers flow off through the area 20 to the overflow area (drain) 16 before a flow of minority carriers from one sensor element into another sensor element can arise. During the integration of the minority carriers, the overflow electrodes, like the sensor electrodes, lie at positive potential and strip the excess minority carriers out of the substrate.

The sensor according to the invention requires no additional electrodes for the adjustment of the potential threshold between the sensor elements and the overflow drain. Further, the overflow area does not lie directly between two neighboring sensor elements, where it would reduce the component density, but rather lies respectively between every other element on the narrow side of the intervening sensor elements, a place that is present in a bilinear sensor and is unused. A further advantage of the arrangement is that a dark current can be generated only in a very small part of the semiconductor surface. As it is, only a negligible dark current is generated by the accumulation layers under the field shield gate and the transfer gates, so that a dark current worth mentioning could only arise outside of the sensor elements between the field shield gate and the transfer gate. However, the overflow drain lies there and collects a considerable part of the dark current. Further it has turned out that the direct contact of an electrode on a semiconductor body reduces the thermal generation of charge carriers on the surface in the entire surrounding contact in a type of "getter effect".

Since the sensor electrodes and the overflow electrode must both be applied to positive potential, the possibility of designing them as a common electrode strip ensues.

Figure 6:
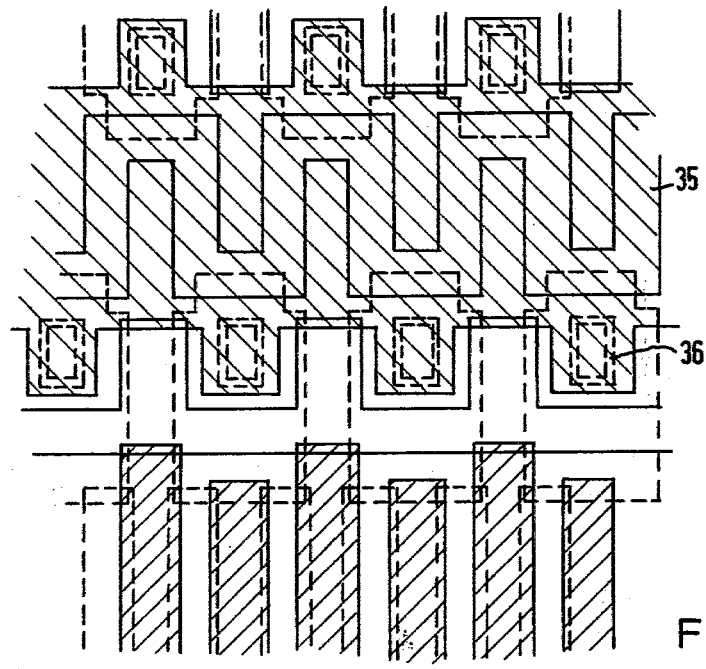
FIG. 6 illustrates the electrodes created from a second polysilicon layer according to FIG. 5 in a preferred sample embodiment.

FIG. 6 shows such a sample embodiment in which the polysilicon strip 35 of the second layer, upon overlapping of the field shield gate, extends both over the sensor elements as well as over the overflow areas and thus simultaneously forms the sensor electrodes and the overflow electrodes. Accordingly, this strip 35 is in surface contact with the overflow areas over the contact windows 36, which, in comparison to the contact windows 23 in FIG. 3, are designed larger. Therefore, the additional advantageous possibility ensues of using polysilicon highly doped with phosphorus or arsenic as the electrode layer and of generating the doping of the overflow areas by means of out-diffusion of doping matter out of this electrode layer.

Therefore, one can advantageously achieve an even further space reduction when one selects the quadrilinear design initially described for the sensor.

For generating the potential thresholds in these sample embodiments, the three possibilities initially mentioned, namely, the use of a field shield gate, of a varying doping and of a varying oxide layer thickness, are used in combination. In principle, another combination of these possibilities can also be selected. Thus, for example, the use of a field shield gate could be dispensed with and the potential threshold between the sensor elements among themselves could be achieved by means of a higher p doping and a thicker insulation layer in the areas previously lying under the field shield gate. By means of a reduction of the p doping or of the insulation layer thickness, the potential threshold between the sensor elements and the overflow areas can then be selected lower than the potential threshold between the sensor elements themselves. Likewise, one could employ a field shield gate but with a uniformity thick insulation layer. One could do this when p doping between the sensor elements is stronger and p doping between sensor elements and overflow areas is weaker. In these instances, too, one achieves a potential threshold between the sensor elements which is larger than the potential threshold between the sensor elements and overflow drain. However, the separation of the individual sensor elements in this instance is less than in the sample embodiments illustrated on the basis of the Figures. Accordingly, such simplified sample embodiments can be employed when the danger of an over-exposure of individual sensor elements is less.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An optoelectronic sensor comprising: a doped semiconductor body of first conductivity type; a row of sensor elements arranged on the semiconductor body comprising metal-insulator-semiconductor MIS capacitor means for the collection of optically generated minority carriers; said sensor elements being separated from one another by first means for providing a potential threshold for the minority carriers in the semiconductor body; at least one shift register formed of further MIS capacitors on each side of the sensor row; transfer gate electrodes arranged laterally at the sensor elements and which alternately connect the sensor elements with a capacitor of the two shift registers by charge-coupling; adjacent each sensor element the surface of the semiconductor body having an overflow area of second conductivity type which extends to a side of the sensor element opposite the corresponding transfer gate; the overflow areas being contacted with an overflow electrode via windows in an insulation layer over the overflow areas; second means for providing a smaller potential threshold for the minority carriers between the overflow areas and the sensor elements in comparison to the potential threshold between the sensor elements themselves; said insulation layer and an electrode layer forming sensor electrodes of the sensor MIS capacitors extending over the sensor element row; and said electrode layer of the sensor electrodes also forming the overflow electrodes.

2. A sensor of claim 1 in which the potential thresholds are provided by forming said insulation layer thicker in areas adjacent the sensor element than in the sensor elements themselves.

3. A sensor of claim 1 in which the potential thresholds are provided by a field shield gate electrode embedded in said insulation layer in areas adjacent said sensor elements.

4. A sensor of claim 1 in which the potential thresholds are provided by a region of said semiconductor body in areas adjacent the sensor elements which is more strongly doped than a doping of neighboring regions of the semiconductor body.

5. A sensor according to claim 1 wherein a field shield gate electrode extends meander-like between the sensor elements and the overflow areas.

6. The sensor of claim 5 wherein the potential threshold between sensor elements and overflow areas is reduced in comparison to the potential threshold between the sensor elements themselves by adapting the semiconductor body doping between the sensor elements so that it deviates from a doping of the semiconductor body between sensor elements and overflow areas.

7. A sensor according to claim 1 wherein the doped semiconductor body comprises a p type silicon.

8. A sensor according to claim 1 wherein sensor electrodes of the sensor elements comprise strongly doped polysilicon.

9. A sensor according to claim 1 wherein the overflow areas are doped by doping particles of second conductivity type which are diffused out of the overflow electrodes.

* * * * *